US009508650B2

(12) United States Patent
Inoue et al.

(10) Patent No.: US 9,508,650 B2
(45) Date of Patent: *Nov. 29, 2016

(54) SEMICONDUCTOR DEVICE WITH LAYOUT OF WIRING LAYER AND DUMMY PATTERNS

(71) Applicant: PS4 LUXCO S.A.R.L., Luxembourg (LU)

(72) Inventors: Michio Inoue, Tokyo (JP); Yorio Takada, Tokyo (JP)

(73) Assignee: Longitude Semiconductor S.a.r.l., Luxembourg (LU)

( * ) Notice: Subject to any disclaimer, the term of this patent is extended or adjusted under 35 U.S.C. 154(b) by 0 days.

This patent is subject to a terminal disclaimer.

(21) Appl. No.: 14/523,062

(22) Filed: Oct. 24, 2014

(65) Prior Publication Data

US 2015/0041970 A1    Feb. 12, 2015

Related U.S. Application Data

(63) Continuation of application No. 13/655,935, filed on Oct. 19, 2012, now Pat. No. 8,895,408, which is a continuation of application No. 12/782,217, filed on May 18, 2010, now Pat. No. 8,349,709.

(30) Foreign Application Priority Data

May 18, 2009    (JP) ................................ 2009-120291

(51) Int. Cl.
*G06F 17/50*    (2006.01)
*H01K 1/00*    (2006.01)
(Continued)

(52) U.S. Cl.
CPC ....... *H01L 23/5386* (2013.01); *G06F 17/5068* (2013.01); *G06F 17/5077* (2013.01);
(Continued)

(58) Field of Classification Search
CPC .......... G06F 17/5068; G06F 17/5072; G06F 17/5081; G06F 17/5077; H03K 19/17724; H01L 2924/14; H01L 23/528; H01L 23/538; H01L 23/5386; H01K 19/17724
USPC ................ 716/118–120, 122, 119, 126, 130; 257/773; 326/41
See application file for complete search history.

(56) References Cited

U.S. PATENT DOCUMENTS 5,763,955 A    6/1998    Findley et al.
5,885,856 A    3/1999    Gilbert et al.
(Continued)

FOREIGN PATENT DOCUMENTS

JP    2002-158278    5/2002
JP    2002-208676    7/2002

*Primary Examiner* — Stacy Whitmore

(57) ABSTRACT

A method of layout of pattern includes the following processes. A graphic data of a first wiring in a first area of a semiconductor wafer is extracted. The first area is a semiconductor chip forming area. The first area is surrounded by a scribed area of the semiconductor wafer. The first area includes a second area. The second area is bounded with the scribed area. The second area has a second distance from a boundary between the semiconductor chip forming area and the scribed area to an boundary between the first area and the second area. A first dummy pattern in the first area is laid out. The first dummy pattern has at least a first distance from the first wiring. A second dummy pattern in the second area is laid out. The second dummy pattern has at least the first distance from the first wiring. The second dummy pattern has at least a third distance from the first dummy pattern.

10 Claims, 10 Drawing Sheets

(51) Int. Cl.
*H01L 29/40* (2006.01)
*H01L 25/00* (2006.01)
*H01L 23/538* (2006.01)

(52) U.S. Cl.
CPC ....... *G06F17/5072* (2013.01); *G06F 17/5081* (2013.01); *H01L 2924/0002* (2013.01); *H01L 2924/14* (2013.01)

(56) References Cited

U.S. PATENT DOCUMENTS

| | | |
|---|---|---|
| 6,335,560 B1 | 1/2002 | Takeuchi |
| 6,495,855 B1 | 12/2002 | Sawamura |
| 6,690,045 B2 | 2/2004 | Shinkawata |
| 6,693,315 B2 | 2/2004 | Kuroda et al. |
| 7,013,446 B2 | 3/2006 | Ohba et al. |
| 7,521,803 B2 | 4/2009 | Morita et al. |
| 7,687,914 B2 | 3/2010 | Kuroda et al. |
| 2002/0061608 A1 | 5/2002 | Kuroda et al. |
| 2002/0089036 A1 | 7/2002 | Shinkawata |
| 2002/0116686 A1* | 8/2002 | Shin ................. H01L 21/76819 716/55 |
| 2004/0195670 A1 | 10/2004 | Landis |
| 2005/0098895 A1 | 5/2005 | Hung |
| 2006/0118960 A1 | 6/2006 | Landis |
| 2007/0011638 A1 | 1/2007 | Watanabe et al. |
| 2008/0164496 A1 | 7/2008 | Kawakami |
| 2008/0164614 A1 | 7/2008 | Ito et al. |
| 2008/0179754 A1 | 7/2008 | Hirabayashi |
| 2008/0211056 A1 | 9/2008 | Kuroda et al. |
| 2008/0315365 A1 | 12/2008 | Takada |
| 2009/0031267 A1 | 1/2009 | Ueki |
| 2009/0032956 A1 | 2/2009 | Landis |
| 2009/0044164 A1 | 2/2009 | Lee |
| 2009/0055792 A1 | 2/2009 | Itagaki |
| 2009/0064078 A1 | 3/2009 | Kimura |
| 2009/0125870 A1 | 5/2009 | Aton et al. |
| 2009/0228854 A1 | 9/2009 | Sakamoto |
| 2009/0276745 A1 | 11/2009 | Nitta |
| 2009/0282374 A1 | 11/2009 | Lu et al. |
| 2010/0252907 A1 | 10/2010 | Doong et al. |
| 2011/0076829 A1 | 3/2011 | Kim et al. |
| 2011/0092042 A1 | 4/2011 | Tone et al. |

* cited by examiner

SEMICONDUCTOR DEVICE WITH LAYOUT OF WIRING LAYER AND DUMMY PATTERNS

BACKGROUND OF THE INVENTION

Field of the Invention

The present invention relates to a method of layout of pattern.

Priority is claimed on Japanese Patent Application No. 2009-120291, filed May 18, 2009, the content of which is incorporated herein by reference.

Description of the Related Art

For manufacturing a semiconductor device including wirings, a CMP (Chemical Mechanical Polishing) method is generally used to planarize the upper surface of an interlayer insulating film, the interlayer insulating film being formed over the wirings.

When the CMP method is performed to planarize the interlayer insulating layer, the flatness of the upper surface of the interlayer insulating film depends on the density of wiring layers underlying the interlayer insulating film. Therefore, in an area having a low density of wiring, a phenomenon such as dishing is likely to be caused. The upper surface of the interlayer insulating film is over-polished and a concave is formed on the upper surface of the interlayer insulating film. Japanese Unexamined Patent Applications, First Publications, Nos. JP-A-2002-158278 and JP-A-2002-208676 each disclose a technique of adjusting the density of wiring layers by laying out dummy patterns. The dummy patterns are formed by the same layer as the wiring layer which is necessary to operate circuits in the semiconductor device. The dummy patterns are not used for operations of circuits of the semiconductor device.

A scribed area (dicing area) is provided on the periphery of each semiconductor chip. The semiconductor chips are arranged over a semiconductor wafer. The scribed area (dicing area) has a width in the range of approximately 50 μm to approximately 100 μm. The dicing process is carried out to dice the semiconductor wafer into plural semiconductor chips. In the scribed area, various kinds of marks such as an alignment mark are usually disposed. The various kinds of marks such as an alignment mark can be used for alignments of wirings in a previous manufacturing process including diffusion processes for the semiconductor chip. In the scribed area, check patterns are also disposed. The check patterns are laid out to check the states during the manufacturing process of the semiconductor chip. When the aforementioned marks or patterns are optically measured, it is preferable not to lay out the aforementioned marks or patterns near the dummy patterns, in order to prevent malfunction due to interference with dummy patterns. The scribed area has a lower density of wiring than the density of wirings laid out in the semiconductor chip area. The scribed area is lower in wiring density than the semiconductor chip area. Therefore, when the polishing is performed by the CMP method, an over-polishing is likely to be caused. The affection of the over-polishing in the scribed area influences the semiconductor chip forming area, the semiconductor chip forming area being adjacent to the scribed area. The interlayer insulating film will generally be thin in the semiconductor chip forming area. Therefore, the reliability of the semiconductor chip is likely to decreases, and predetermined patterns are likely to be difficult to form during a manufacturing process after an interlayer insulating film is formed.

Japanese Unexamined Patent Application, First Publication, No. JP-A-2002-208676 discloses that to prevent the interlayer insulating film from being thin near the scribed area, CMP dummy patterns are laid out such that the density of the CMP dummy patterns is over 50 percents, and enlarged dummy patterns are laid out. Japanese Unexamined Patent Application, First Publication, No. JP-A-2002-208676 discloses that dummy patterns are changed in size and the size-changed dummy patterns are then placed such that the density of wirings is over 50 percents in a predetermined area. Therefore, the process for laying out of the dummy patterns will be complicated.

SUMMARY

In one embodiment, a method of layout of pattern may include, but is not limited to, the following processes. A first dummy pattern is laid out in a first area of a semiconductor wafer. The first area includes a first wiring. The first dummy pattern has a first distance from the first wiring. A second dummy pattern is laid out in the first area, the second pattern having a second distance from the first wiring. The second pattern has a third distance from the first dummy pattern.

In another embodiment, a method of manufacturing a semiconductor device may include, but is not limited to, the following processes. A first wiring and first and second dummy patterns are formed over a semiconductor wafer. The first wiring and first and second dummy patterns are positioned in a first area of the semiconductor wafer. The first dummy pattern has a first distance from the first wiring. The second pattern has a second distance from the first wiring. The second pattern has a third distance from the first dummy pattern. The first area is bounded with a second area of the semiconductor wafer. An interlayer insulative film is formed over the first and second areas. The interlayer insulative film covers the first wiring, the first and second dummy patterns. A chemical mechanical polishing process is performed to polish the interlayer insulative film. The first and second dummy patterns prevent the interlayer insulative film in the first area from being polished, while allowing the interlayer insulative film in the second area to be polished.

In still another embodiment, a method of layout of pattern may include, but is not limited to, the following processes. A first dummy pattern is laid out in a first area which is included in a chip area of a semiconductor wafer. The first area is bounded with a scribed area of the semiconductor wafer. The first area includes a first wiring. The first dummy pattern has a first distance from the first wiring. A second dummy pattern is laid out in the first area after laying out the first dummy pattern. The second pattern has a second distance from the first wiring. The second pattern has a third distance from the first dummy pattern. The first, second and third distances are unchanged once the first dummy pattern and the second dummy pattern have been laid out.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
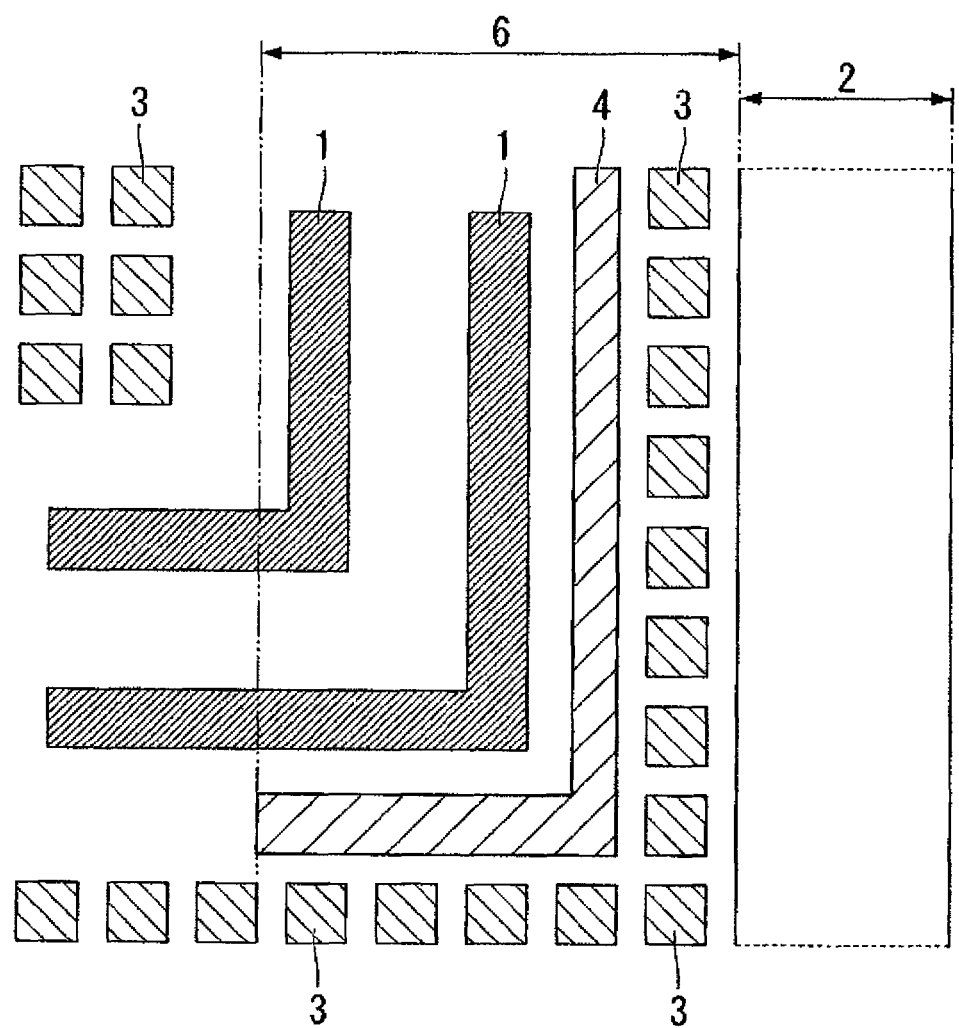
FIG. 1 is a plan view illustrating a part of a semiconductor wafer including dummy patterns laid out according to an embodiment of the invention.

In one embodiment, a method of layout of pattern may include, but is not limited to, the following processes. A graphic data of a first wiring in a first area of a semiconductor wafer is extracted. The first area is a semiconductor chip forming area. The first area is surrounded by a scribed area of the semiconductor wafer. The first area includes a second area. The second area is bounded with the scribed area. The second area has a second distance from a boundary between the semiconductor chip forming area and the scribed area to an boundary between the first area and the second area. A first dummy pattern in the first area is laid out. The first dummy pattern has at least a first distance from the first wiring. A second dummy pattern in the second area is laid out. The second dummy pattern has at least the first distance from the first wiring. The second dummy pattern has at least a third distance from the first dummy pattern.

In some cases, laying out the first dummy pattern may include following processes. A third area that encompasses the first wiring is set. The third area is included in the first area. The first dummy pattern not to overlap the third area is laid out.

In some cases, the third area may be set such that a boundary between the first area and the third area has the first distance from a pattern edge of the first wiring.

In some cases, laying out the first dummy pattern may include following processes. A third area that encompasses the first wiring is set. A third dummy pattern in the first area is laid out. An overlapping portion of the third dummy pattern which is disposed over the third area to decide a layout of the first dummy pattern is removed.

In some cases, the third area may be set such that a boundary between the first area and the third area has the first distance from a pattern edge of the first wiring.

In some cases, laying out the second dummy pattern may be performed after laying out the first dummy pattern.

In some cases, laying out the second dummy pattern may include following processes. A fourth area encompassing the first wiring is set. A fifth area encompassing the first dummy pattern is set. A sixth area covering the first area without the second area is set. The second dummy pattern in the first area not to overlap the fourth, fifth and sixth areas is laid out.

In some cases, the fourth area may be set such that a boundary between the first area and the fourth area has the first distance from a pattern edge of the first wiring. The fifth area may be set such that a boundary between the first area and the fifth area has the third distance from a pattern edge of the first dummy pattern.

In some cases, laying out the second pattern may include following processes. A fourth area encompassing the first wiring is set. A fifth area encompassing the first dummy pattern is set. A sixth area covering the first area without the second area is set. A fourth dummy pattern in the first area is laid out. An overlapping portion of the fourth dummy pattern which is disposed over the fourth, fifth and sixth areas to decide a layout of the second dummy pattern is removed.

In some cases, the fourth area may be set such that a boundary between the first area and the fourth area has the first distance from a pattern edge of the first wiring. The fifth area may be set such that a boundary between the first area and the fifth area has the third distance from a pattern edge of the first dummy pattern.

In some cases, the method may further include following processes. A width of the second dummy pattern after deciding the layout of the second dummy pattern is checked. A part of the second dummy pattern is removed. The width of the removed part of the second dummy pattern is smaller than a predetermined value.

In some cases, the method may further include following processes. An area dimension of the second dummy pattern after deciding the layout of the second dummy pattern is checked. A part of the second dummy pattern into a plurality of divided patterns is divided. The area dimensions of the part of the second dummy pattern is larger than a predetermined value before dividing. Each of the divided pattern has a smaller area dimension than the predetermined value.

In some cases, the first dummy pattern may include a plurality of fifth dummy patterns, each of the fifth dummy pattern having a predetermined shape.

In some cases, the fifth dummy pattern may include a plurality kind of sub-patterns, each kind of sub-patterns having a predetermined shape.

In some cases, the second dummy pattern may include a plurality of sixth dummy patterns. At least two of the sixth dummy pattern have different shapes from each other.

In some cases, the predetermined shape may be a square shape or a rectangular shape.

In some cases, the predetermined shape may be a square shape, and each kind of sub-patterns having a different length at one side of the square shape.

According to the aforementioned configurations, it is possible to increase the density of wiring in the area adjacent to the scribed area without performing complex logical operations. Therefore, it is possible to prevent the interlayer insulating film from being thin in the semiconductor chip formation area adjacent to the scribed area.

In addition, it is possible to avoid the problem with forming a short circuit between wiring layers due to increase of parasitic capacitance or due to attachment of inclusions during manufacturing processes, by laying out a second dummy pattern only in a predetermined area adjacent to the scribed area.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

FIG. 1 is a plan view illustrating layout of dummy patterns on a part of a semiconductor wafer. FIG. 1 illustrates an area which is a part of a semiconductor wafer. Wiring layers 1 are provided in a semiconductor chip forming area. The wiring layers 1 contribute to circuit operations. A scribed area 2 is laid out at the periphery of the semiconductor chip forming area. The scribed area 2 has a predetermined width. The width may be in the range of, but not limited to, approximately 50 μm to approximately 100 μm. The semiconductor chip forming area is surrounded by the scribed area 2. First dummy patterns 3 have a predetermined shape, for example, but not limited to, a rectangular shape. A second dummy pattern 4 is laid out within an area having a predetermined distance 6 from the boundary between the scribed area 2 and the semiconductor chip forming area.

The first dummy patterns 3, the second dummy pattern 4 and the wirings 1 are formed by the same patterning process for patterning the same wiring layer. The wiring layer may be made of, but not limited to, metals such as tungsten, or polysilicon. The wiring may have, but not limited to, a multi-layered structure that includes a plurality of conductive layers. The wiring may be formed by patterning a multi-layered structure that includes an insulating layer such as silicon nitride and a metal layer underlying the insulating layer.

Figure 2:
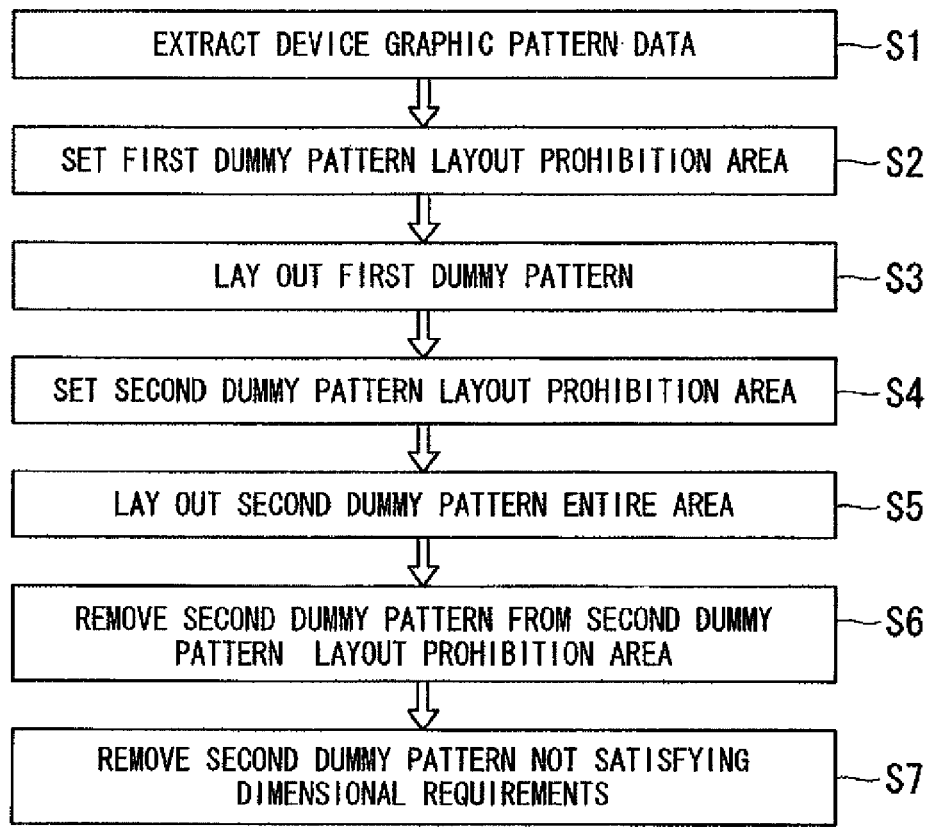
FIG. 2 is a flowchart illustrating layout processes for dummy patterns according to the embodiment of the invention.

FIG. 2 is a flowchart illustrating layout processes for laying out dummy patterns.

In Step S1, graphic data is extracted. The graphic data defines shape and position of the wiring 1 (FIG. 4) which has previously been laid out in the semiconductor chip forming area.

Figure 4:
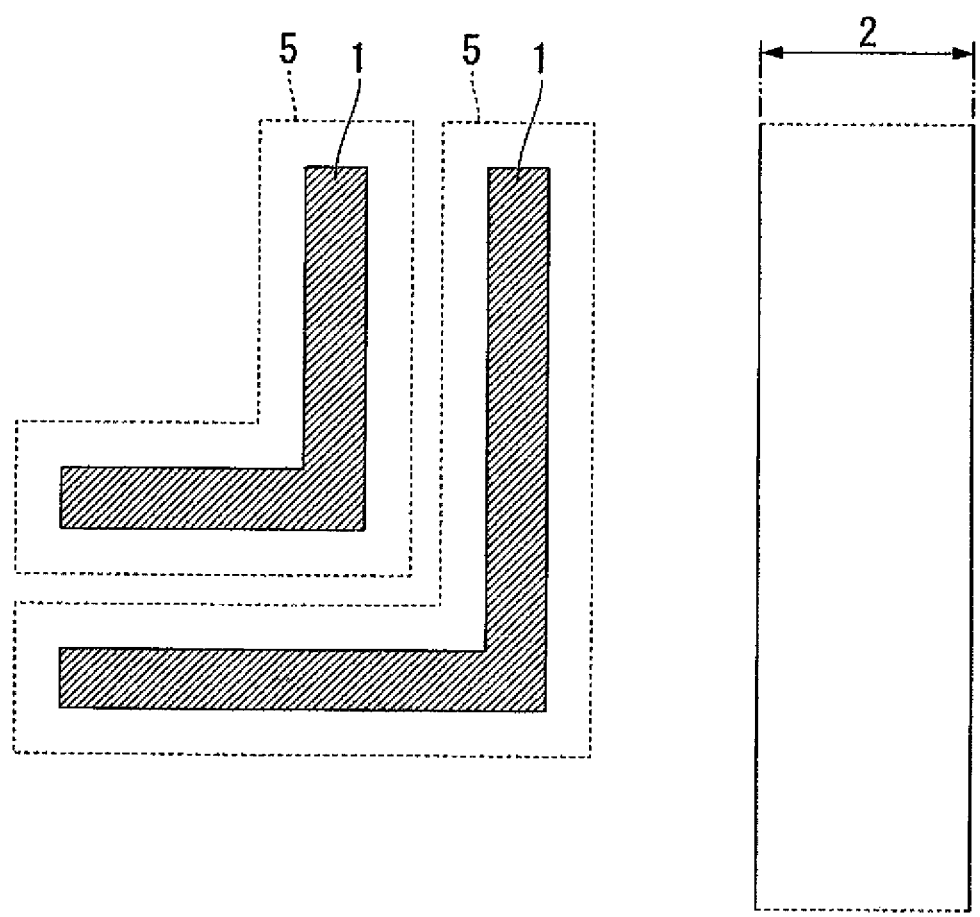
FIG. 4 is a plan view showing a process for setting first dummy pattern layout prohibition areas according to the embodiment of the invention.

In Step S2, as shown in FIG. 4, first dummy pattern layout prohibition areas 5 are set such that the first dummy pattern layout prohibition areas 5 encompass the wirings 1. The first dummy pattern layout prohibition areas 5 and the wirings 1 are separated from each other by a predetermined distance. It is preferable to prevent increase in parasitic capacitance of the wiring 1 due to layout of dummy patterns adjacent to the wirings 1. It is preferable that the wirings 1 which contribute circuit operations are separated from dummy patterns by a predetermined distance. The predetermined distance is adequate to cause no affection to circuit operations of a semiconductor chip. Previously, it is determined how much the dummy patterns are distant from the wirings 1. Then, the first dummy pattern layout prohibition areas 5 are positioned based on the previously determined distance.

Figure 5:
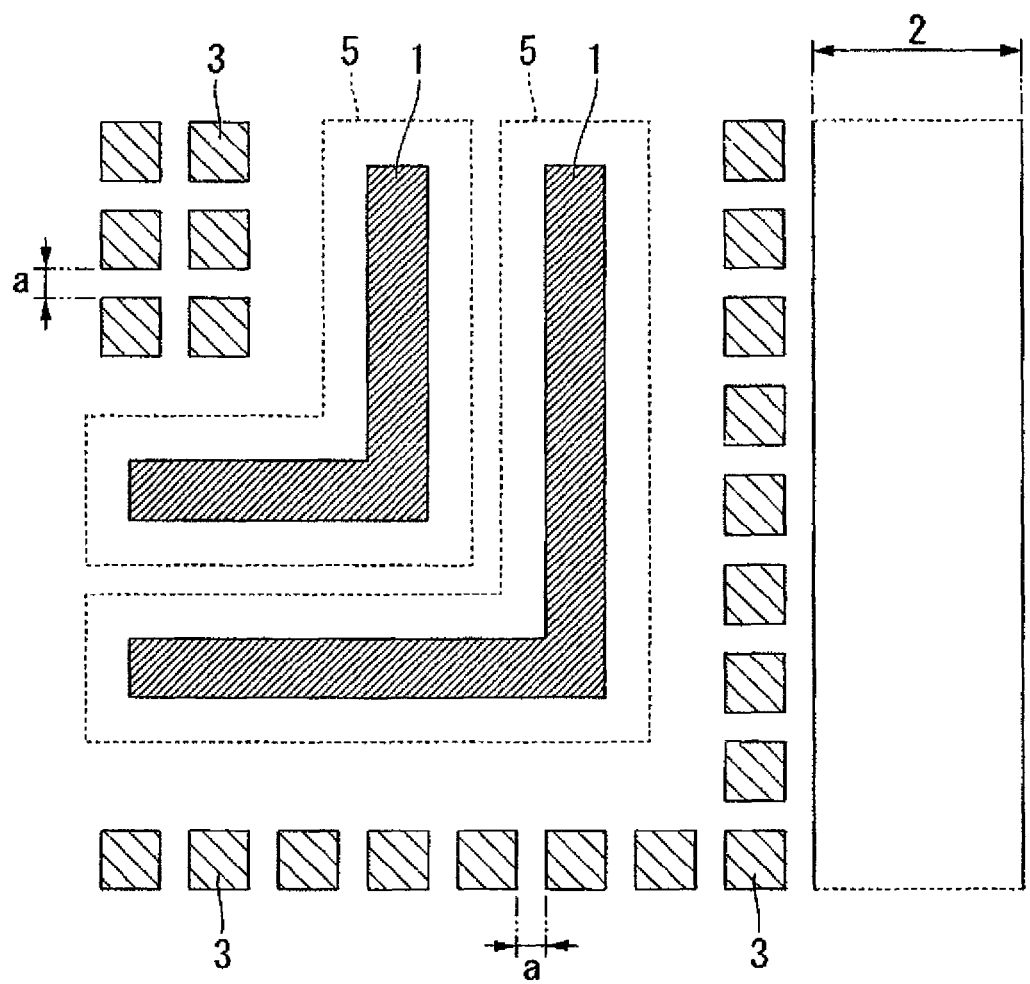
FIG. 5 is a plan view illustrating layout of first dummy patterns according to the embodiment of the invention.

In Step S3, as shown in FIG. 5, the first dummy patterns 3 which have a rectangular shape are laid out on the semiconductor chip forming area. The first dummy patterns 3 are laid out at a pitch which corresponds to a previously predetermined distance "a". For laying out the first dummy patterns 3, logical operations are performed to determine whether the first dummy pattern layout prohibition area 5 which has been set in Step S2 overlaps the first dummy pattern 3. If at least a part of the dummy pattern 3 overlaps the first dummy pattern layout prohibition area 5, then the first dummy pattern 3 is not laid out.

As another way, the first dummy patterns may be laid out by two steps as described below.

Figure 3:
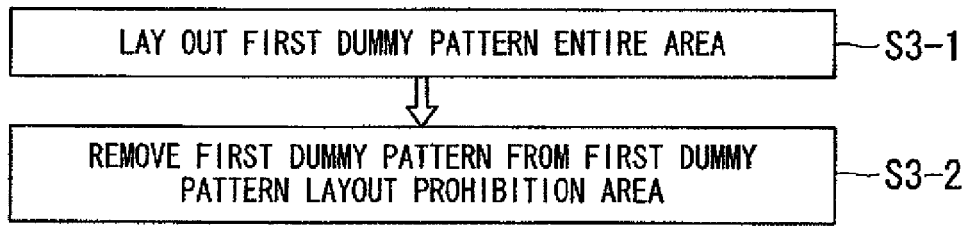
FIG. 3 is a flowchart illustrating layout processes as a modification to the layout process S3 in FIG. 2 according to another embodiment of the invention.
Figure 6:
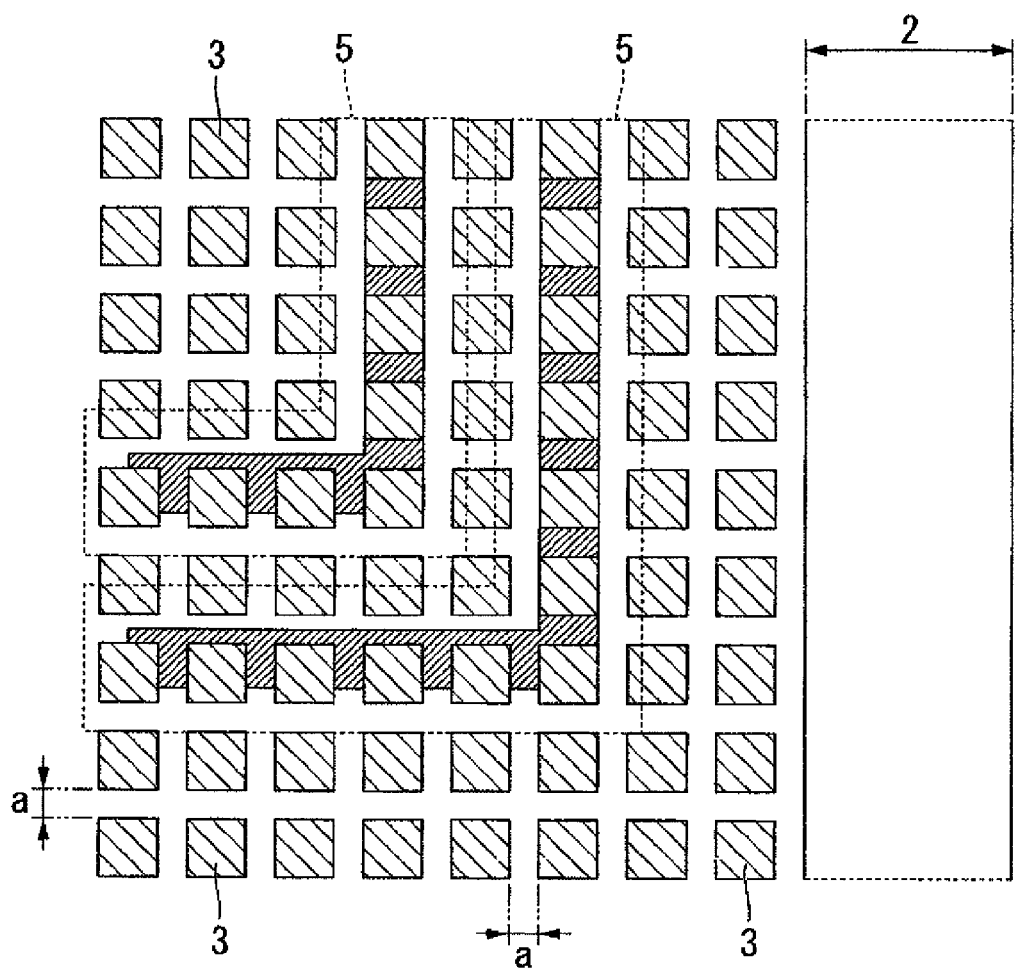
FIG. 6 is a plan view illustrating layout of first dummy patterns according to another embodiment of the invention.

In Step S3-1 in FIG. 3 and as shown in FIG. 6, the first dummy patterns 3 are laid out at the pitch "a" entirely on the semiconductor chip forming area. In this step, is not necessary to consider positional relationship between the first dummy patterns 3 and the first dummy pattern layout prohibition area 5. As Step S3-2 in FIG. 3, the logical operations are performed based on the positions of the first dummy patterns 3 and the first dummy pattern layout prohibition areas 5. The first dummy pattern 3 if overlapping at least a part of the first dummy pattern layout prohibition area 5 is removed. As shown in FIG. 5, the first dummy patterns 3 is permitted to be laid out as long as the first dummy patterns 3 do not overlap the first dummy pattern layout prohibition area 5.

In FIGS. 5 and 6, the first dummy patterns 3 have a square-shape. In other cases, the first dummy patterns 3 may have a rectangular-shape.

The size or the length of each side of the first dummy pattern 3 is not limited. To work as dummy patterns, and to prevent stripping of patterns during manufacturing processes, the size of the first dummy pattern 3 is preferably in the range of 1.2 times to 2 times of the minimum line width or design rule value of the wiring 1.

Figure 10A:
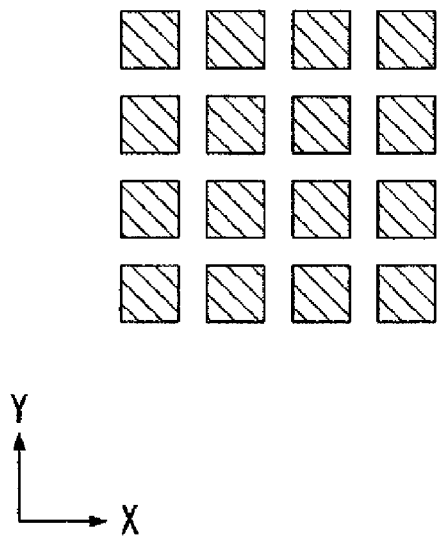
FIG. 10A is a plan view showing first dummy patterns disposed along X and Y directions to form tetragonal lattice.
Figure 10B:
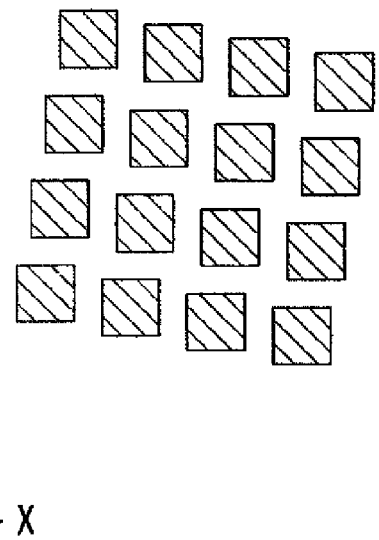
FIG. 10B is a plan view showing layout of first dummy patterns having predetermined angles against X and Y directions.

Layout of the first dummy patterns 3 is not limited. It is not essential that the first dummy patterns 3 are disposed along X and Y directions to form square-matrix as shown in FIG. 10A. In some cases, the first dummy patterns 3 may be laid out with a predetermined angle to X and Y directions as shown in FIG. 10B.

The first dummy patterns 3 may have other shapes than the rectangular-shape. For example, the first dummy patterns 3 may have, but not limited to, a polygon-shape or a cross-shape.

The first dummy patterns 3 may include different patterns. In some cases, the first dummy patterns 3 may include, but is not limited to, a first square pattern and a second square pattern. The first square pattern has a first length of one side. The second square pattern has a second length of one side. The second length is different from the first length. In other cases, the first dummy patterns 3 may include, but is not limited to, one or more square patterns and one or more rectangular patterns. In other cases, the first dummy patterns 3 may include, but is not limited to, more than two different shape patterns. As shown in FIGS. 10A and 10B, the first dummy patterns 3 may include, but is not limited to, patterns having different layout angles. In some cases, a plurality of predetermined shape patterns may be used as the first dummy patterns 3. The distance between each predetermined shape pattern and the wiring 1 is optimized. The distance between the predetermined shape patterns is optimized. Both the optimizations are carried out independently from each other. After optimization, the first dummy patterns 3 may be laid out.

Figure 7:
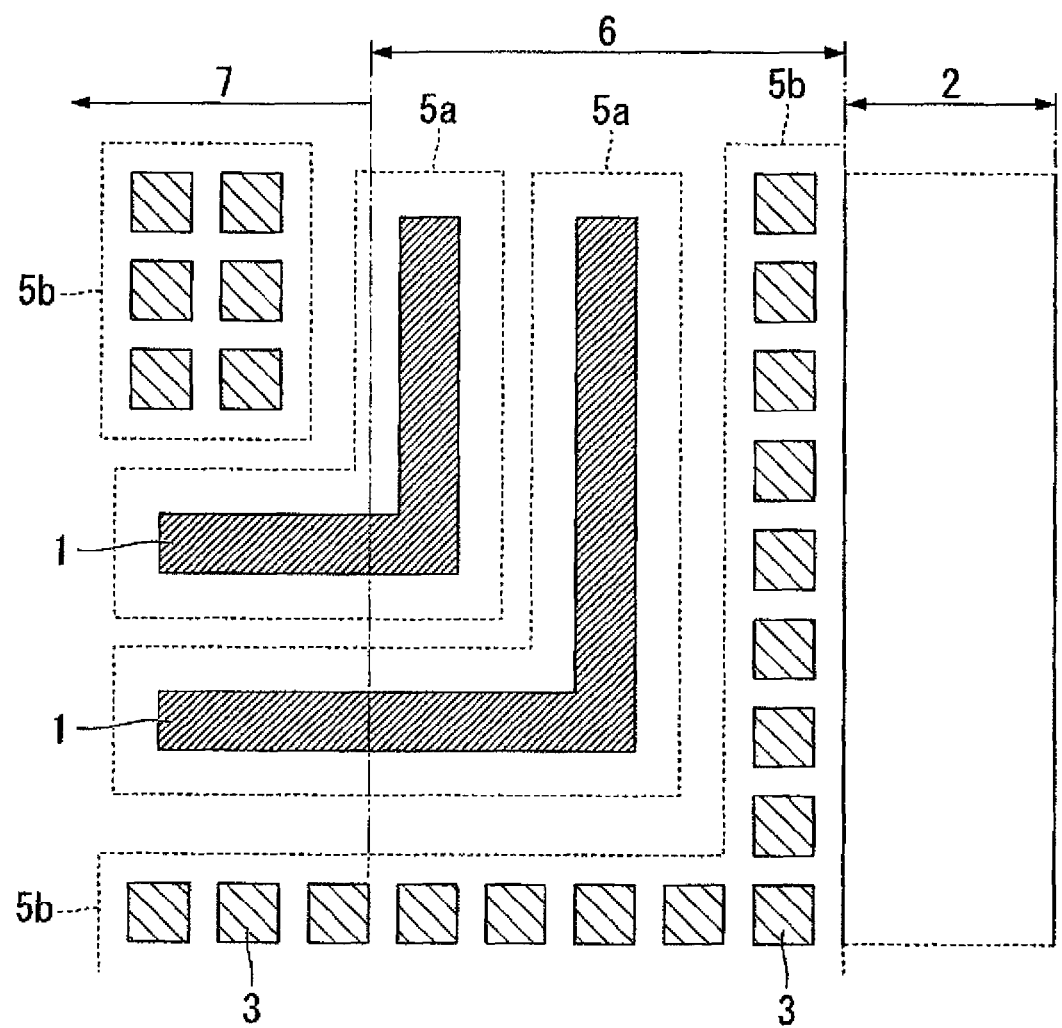
FIG. 7 is a plan view showing a process for setting second dummy pattern layout prohibition areas according to the embodiment of the invention.

In Step S4, as shown in FIG. 7, the second dummy pattern layout prohibition areas 5a are laid out such that the second dummy pattern layout prohibition areas 5a have a predetermined distance from the outer peripheries of the wirings 1 and that the second dummy pattern layout prohibition areas 5a encompass the wirings 1. In some cases, the second dummy pattern layout prohibition areas 5a may be, but is not limited to, the same as the first dummy pattern layout prohibition areas 5 which have been previously set.

The second dummy pattern layout prohibition areas 5b are set such that the second dummy pattern layout prohibition areas 5b encompass the first dummy patterns 3, the second dummy pattern layout prohibition areas 5b are separated by a predetermined distance from the outer peripheries of the first dummy patterns 3. In FIG. 7, the second dummy pattern layout prohibition areas 5b encompass each group of the first dummy patterns 3, wherein the second dummy pattern layout prohibition areas 5b are presented by broken lines. In other cases, the second dummy pattern layout prohibition areas 5b may encompass each of the first dummy patterns 3. In this case, one second dummy pattern layout prohibition area 5b may overlap part of another second pattern layout prohibition area 5b. If a plurality of predetermined shape patterns are laid out as the first dummy patterns 3, the second dummy pattern layout prohibition areas 5b may be set such that the second dummy pattern layout prohibition areas 5b encompasses each of the predetermined shape patterns with different distances. The second dummy pattern layout prohibition areas 5a and 5b may be set to have the same distances from the wirings 1 and from the first dummy pattern 3.

Figure 11:
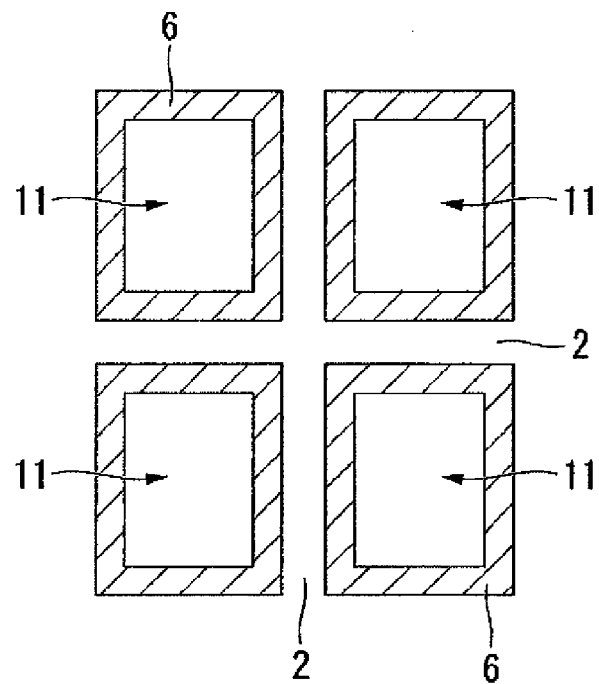
FIG. 11 is a plan view illustrating second dummy pattern layout areas adjacent to scribed area according to the embodiment of the invention.

The area which has a predetermined distance from the boundary between the scribed area 2 and the semiconductor chip forming area is set as the second dummy pattern disposition permission areas 6. The second dummy pattern layout prohibition area 7 is set inside the second dummy pattern disposition permission area 6. As shown in FIG. 11, if the four semiconductor chips 11 and the scribed area 2 are laid out, the second dummy pattern layout permission areas 6 (diagonal line areas in FIG. 10) are placed at the peripheral areas adjacent to the scribed area of each semiconductor chips 11. The second dummy pattern layout permission area 6 has a predetermined width. The second dummy pattern layout prohibition areas 7 are the area inside the second dummy pattern disposition permission areas 6.

Figure 8:
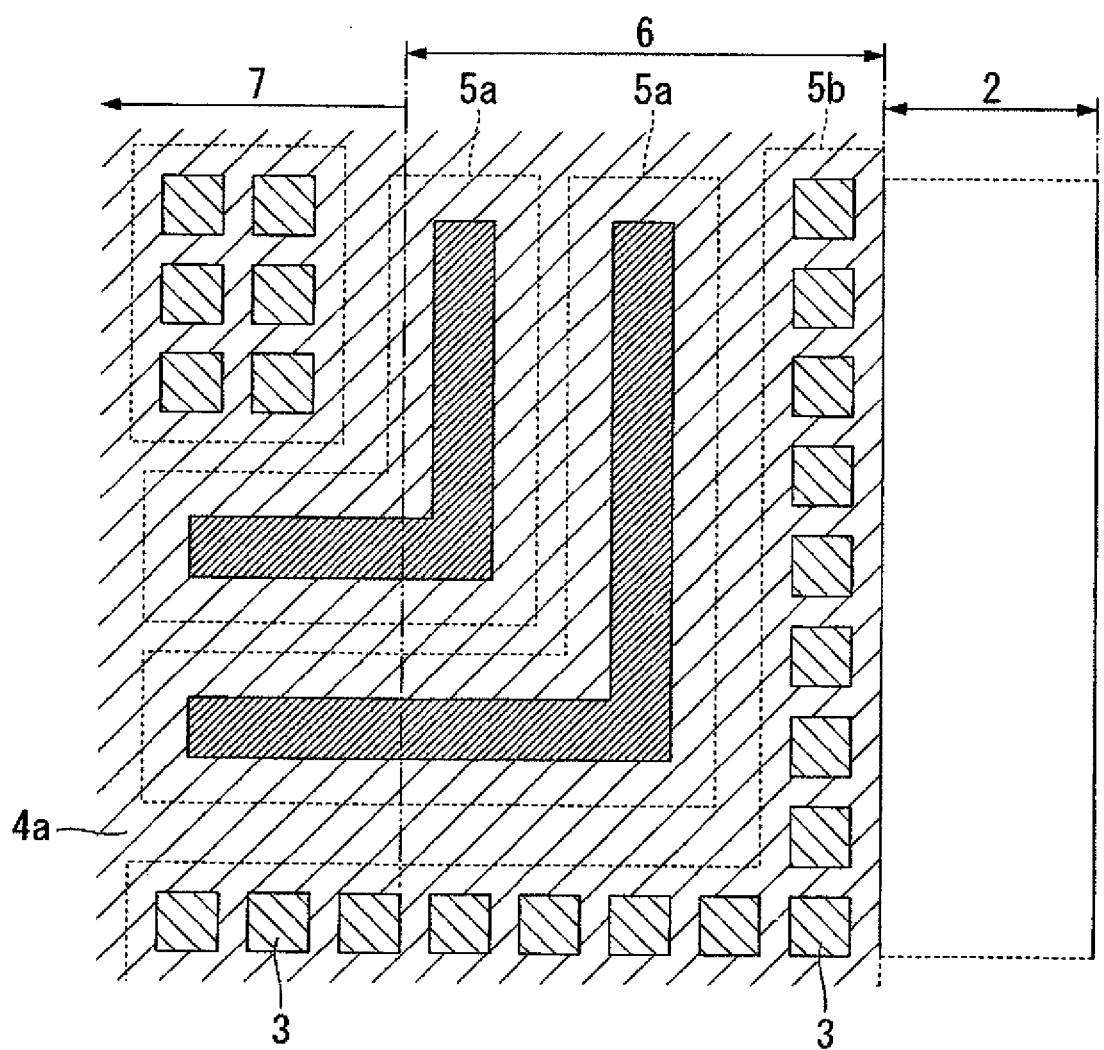
FIG. 8 is a plan view illustrating layout of second dummy patterns according to the embodiment of the invention.

In Step S5, as shown in FIG. 8, the second dummy pattern 4a is laid out such that the second dummy pattern 4a covers entirely the semiconductor chip forming area. The second dummy pattern 4a is laid out to cover entirely the semiconductor chip forming area without being divided into rectangular shape patterns.

Figure 9:
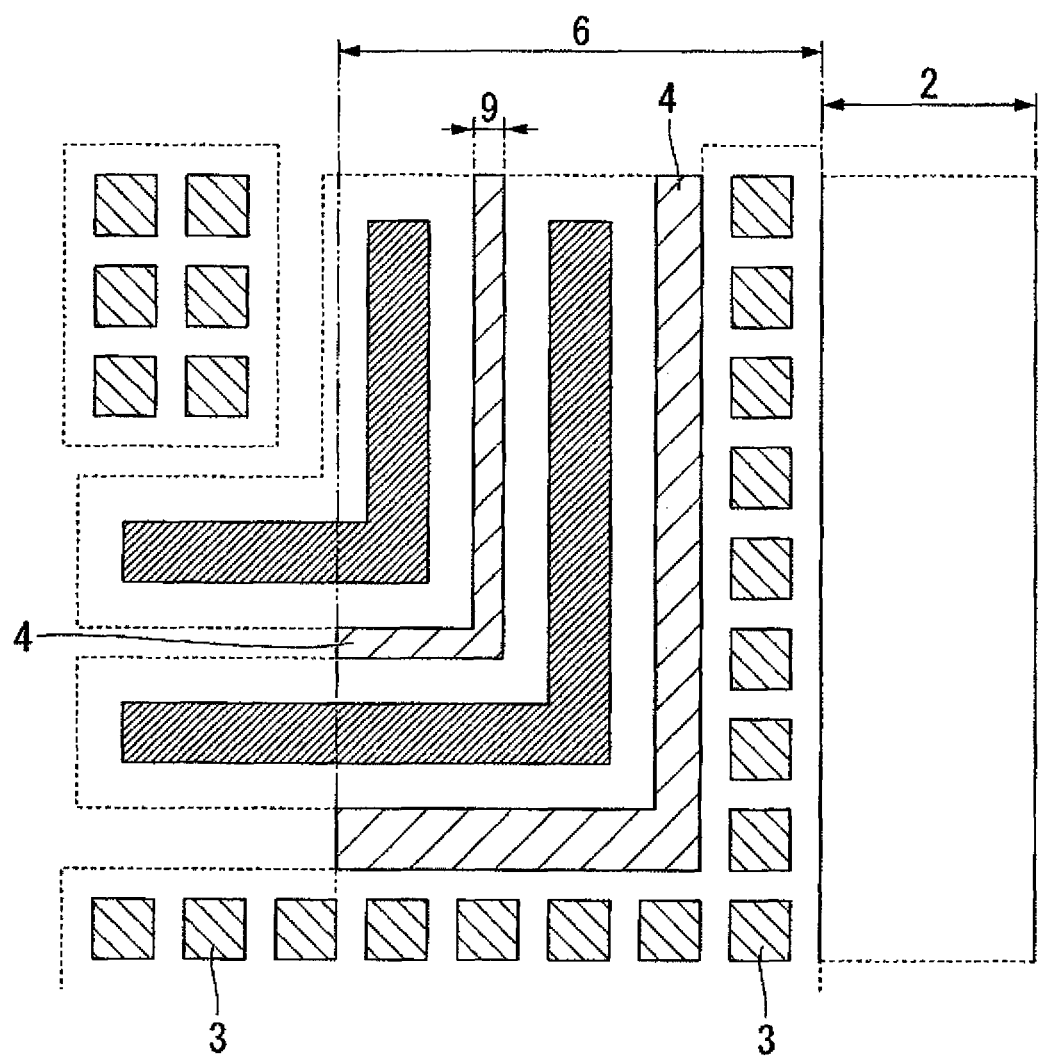
FIG. 9 is a plan view showing a removal process for removing second dummy patterns from the layout prohibition areas according to the embodiment of the invention.

In Step S6, as shown in FIG. 9, logical operations are performed based on the positions of the previously set second dummy pattern layout prohibition areas 5a, 5b and 7, so as to remove the data of the second dummy pattern 4a which is included in the second dummy layout area, while leaving the data of the second dummy pattern 4 which is not included in the second dummy layout area.

Layout of the second dummy pattern may be performed by laying out the second dummy patterns entirely except for the second dummy pattern layout prohibition areas 5a, 5b and 7.

Remaining second dummy pattern 4 may include pattern 9 in FIG. 9 which is narrower than minimum line width of the wiring 1. In Step S7, the second dummy pattern 4 which does not satisfy the requirements for dimensions is extracted and removed.

In Step S7, the area of the second dummy pattern 4 which is a continuing pattern may be calculated, and the second dummy pattern 4 may be divided into patterns with smaller size if the area of the second dummy pattern 4 is greater than the previously set predetermined standard area.

According to the aforementioned Steps S1 to S7, as shown in FIG. 1, the first dummy patterns 3 and the second dummy patterns 4 have been laid out.

The effects of laying out the dummy patterns described above will be described below.

Figure 12A:
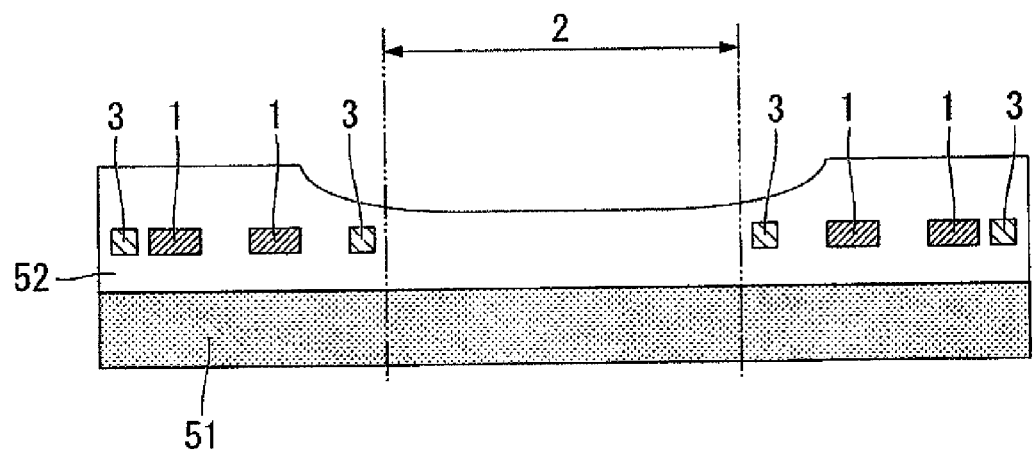
FIG. 12A is a cross sectional view illustrating a semiconductor chip including semiconductor devices with first dummy patterns which are disposed outside the scribed area.

FIG. 12A is a cross sectional view illustrating a semiconductor chip including semiconductor devices with first dummy patterns which are laid out opposite sides with reference to the scribed area 2.

The wirings 1 which contribute circuit operations and an interlayer insulating film 52 are provided over a semiconductor substrate 51. The first dummy patterns 3 with a rectangular shape are provided.

As shown in FIG. 12A, if no wirings are provided at the scribed area 2 or if the density of wirings is very low, a concave portion is formed on the interlayer insulating film 52 by excesses polishing by CMP. The concave portion will provide affection to adjacent semiconductor chip forming area. The affection reduces the film thickness of the interlayer insulating film which is disposed over the wiring layer 1 adjacent to the scribed area 2.

Figure 12B:
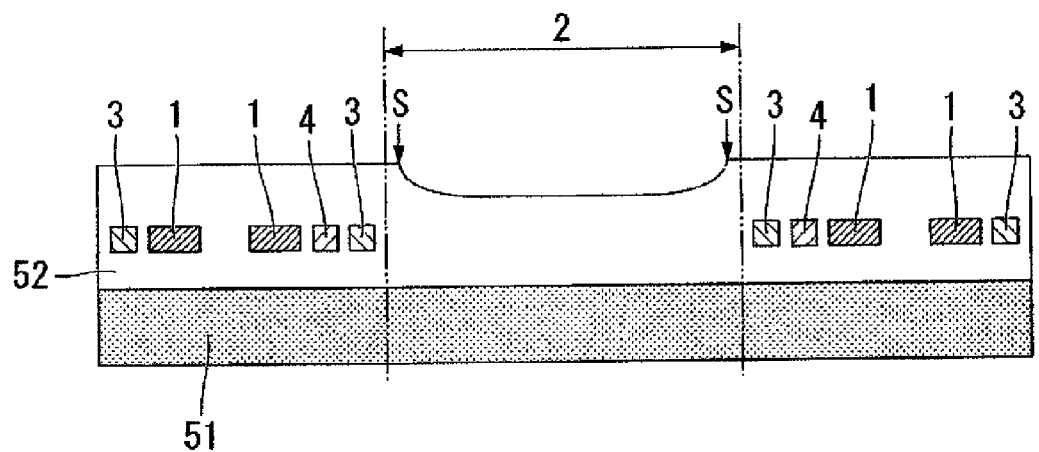
FIG. 12B is a cross sectional view illustrating a semiconductor chip including semiconductor devices with first and second dummy patterns which are disposed outside the scribed area.

FIG. 12B is a cross sectional view illustrating first and second rectangular dummy patterns 3 and 4. The first and second dummy patterns 3 and 4 are laid out using the aforementioned methods.

The wiring density in the area adjacent to the scribed area is increased by laying out the second dummy patterns 4. The increased wiring density will prevent excess polishing by CMP. Increasing the wiring density will shift the position S toward the inside area of the scribed area 2, wherein is the edge of the concave portion is positioned at the position S. Therefore, it is possible to prevent thickness reduction of the interlayer insulating film over the wiring layer 1 which is adjacent to the scribed area 2.

In the present embodiment, in Steps S1 to S7, it is not necessary to perform any complicated calculations. Therefore, it is possible to easily lay out the first and second dummy patterns 3 and 4.

It is possible to prevent a short circuit formation between wiring layers. The short circuit formation is due to increase of parasitic capacitance or due to attachment of inclusions during manufacturing processes. The short circuit formation can be prevented by laying out the second dummy pattern only in the area (6) with a predetermined width adjacent to the scribed area.

The second dummy pattern layout permission area 6 with a predetermined width is set to be adjacent to the scribed area 2. The width of the second dummy pattern layout permission area 6 is not limited. It is preferable that the width of the second dummy pattern layout permission area 6 is about one to two times of the width of the scribed area 2.

The semiconductor device according to the embodiment of the invention includes dummy patterns which are the same layer as the wiring layer 1. The semiconductor device includes the first dummy patterns 3 having a predetermined distance from the wiring 1. Within the area 6 having a predetermined width adjacent to the scribed area 2, the second dummy pattern 4 is laid out. The second dummy pattern 4 is separated by a predetermined distance from the wiring 1. The second dummy pattern 4 is separated by another predetermined distance from the first dummy patterns 3.

The manufacture method of the semiconductor device having the dummy patterns may include the following steps. The wiring layer is formed in the semiconductor chip forming area of the semiconductor wafer. Then, first dummy patterns are formed, which have a predetermined distance from the wiring layer. Then, within the area with a predetermined width adjacent to the scribed area which encompasses the semiconductor chip forming area, the second dummy patterns are formed. The second dummy pattern has a predetermined distance from the wiring layer. The second dummy pattern has a predetermined distance from the first dummy patterns. Therefore, the wiring layer, the first and second dummy patterns are formed. Then, each of the semiconductor chip forming areas is divided into the semiconductor chips, wherein the semiconductor chip forming area is divided along the scribed area. Therefore, the semiconductor device is manufactured.

It is apparent that the present invention is not limited to the above embodiments, but may be modified and changed without departing from the scope and spirit of the invention.

The invention claimed is:

1. A semiconductor device, comprising:
   a semiconductor substrate;
   a wiring layer formed over the semiconductor substrate and extending in a first direction from a top view;
   a first plurality of first dummy patterns arranged in a line extending in the first direction, the first plurality of first dummy patterns being disposed in a same layer as the wiring layer, each of the first plurality of first dummy patterns having a first length in the first direction and a first width in a second direction perpendicular to the first direction, and having a substantially square shape; and
   a second dummy pattern placed between the wiring layer and the first plurality of first dummy patterns, the second dummy pattern being disposed in a same layer as the wiring layer and comprising a first portion extending in the first direction, the first portion having a second length greater than the first length in the first direction, and a second width in the second direction, wherein
   the first dummy patterns have a shape different from a shape of the second dummy pattern.

2. The semiconductor device as claimed in claim 1, further comprising a second plurality of first dummy patterns arranged in a line extending in the second direction.

3. The semiconductor device as claimed in claim 1, wherein the second dummy pattern further comprises a second portion connected to an end of the first portion, the second portion extending in the second direction.

4. The semiconductor device as claimed in claim 1, wherein the second width of the first portion of the second dummy pattern is smaller than the first width of each of the plurality of first dummy patterns.

5. A semiconductor device, comprising:
   a semiconductor substrate;
   a wiring layer formed over the semiconductor substrate and extending in a first direction from a top view, the wiring layer having a first width in a second direction perpendicular to the first direction;
   a first plurality of first dummy patterns arranged in a line extending in the first direction, the first plurality of first dummy patterns being disposed in a same layer as the wiring layer, each of the first plurality of first dummy patterns having a second width in the second direction, and having a substantially square shape; and
   a second dummy pattern placed between the wiring layer and the first plurality of first dummy patterns, the second dummy pattern being disposed in a same layer as the wiring layer and comprising a first portion extending in the first direction, the first portion having a third width in the second direction, the third width being smaller than the first width and the second width.

6. The semiconductor device as claimed in claim 5, further comprising a second plurality of first dummy patterns arranged in a line extending in the second direction.

7. The semiconductor device as claimed in claim 5, wherein the second dummy patterns further comprises a second portion connected to an end of the first portion, the second portion extending in the second direction.

8. A semiconductor device, comprising:
   a semiconductor substrate;
   a wiring layer formed over the semiconductor substrate and extending in a first direction from a top view, the wiring layer having a first width in a second direction perpendicular to the first direction;
   a first plurality of first dummy patterns arranged in a line extending in the first direction, the first plurality of first dummy patterns being disposed in a same layer as the wiring layer, each of the first plurality of first dummy patterns having a first length in the first direction and a second width in the second direction, and having a substantially square shape; and
   a second dummy pattern placed between the wiring layer and the first plurality of first dummy patterns, the second dummy pattern being disposed in a same layer as the wiring layer and comprising a first portion extending in the first direction, the first portion having a second length greater than the first length in the first direction, the first portion having a third width in the second direction, the third width being smaller than the first width and the second width.

9. The semiconductor device as claimed in claim 8, further comprising a second plurality of first dummy patterns arranged in a line extending in the second direction.

10. The semiconductor device as claimed in claim 8, wherein the second dummy patterns further comprises a second portion connected to an end of the first portion, the second portion extending in the second direction.

* * * * *